(12) United States Patent
Kirk et al.

(10) Patent No.: US 9,658,000 B2
(45) Date of Patent: May 23, 2017

(54) FLEXIBLE METALLIC HEAT CONNECTOR

(71) Applicant: Abaco Systems, Inc., Huntsville, AL (US)

(72) Inventors: Graham Charles Kirk, Towcester (GB); Stuart Connolly, Towcester (GB); Tao Deng, Niskayuna, NY (US); Zeshan Jabar Hussain, Towcester (GB); Binoy Milan Shah, Niskayuna, NY (US)

(73) Assignee: Abaco Systems, Inc., Charlottesville, VA (US)

( * ) Notice: Subject to any disclaimer, the term of this patent is extended or adjusted under 35 U.S.C. 154(b) by 608 days.

(21) Appl. No.: 13/750,078

(22) Filed: Jan. 25, 2013

(65) Prior Publication Data

US 2013/0206363 A1    Aug. 15, 2013

Related U.S. Application Data

(60) Provisional application No. 61/599,191, filed on Feb. 15, 2012.

(51) Int. Cl.
*H01L 23/427*      (2006.01)
*F28F 7/00*        (2006.01)
(Continued)

(52) U.S. Cl.
CPC .............. *F28F 7/00* (2013.01); *B23P 15/26* (2013.01); *H01L 23/4275* (2013.01);
(Continued)

(58) Field of Classification Search
CPC .................. H05K 7/20454; H01L 23/4275
(Continued)

(56) References Cited

U.S. PATENT DOCUMENTS 3,971,186 A     7/1976  Havelka et al.
4,069,498 A *   1/1978  Joshi ................... H01L 23/3677
                                                165/80.2
(Continued)

FOREIGN PATENT DOCUMENTS

DE      19811603 A1    9/1998
EP      0875933 A2    11/1998
(Continued)

OTHER PUBLICATIONS

International Search Report from corresponding WO Application No. PCT/US2013/23402 dated Apr. 22, 2013.
(Continued)

*Primary Examiner* — Allen Flanigan
(74) *Attorney, Agent, or Firm* — Meunier Carlin & Curfman LLC

(57) ABSTRACT

A thermal connector configured to be placed within a recess of a heat sink between the heat sink and a heat generating component and transfer heat from the component to the heat sink, including a heat spreader configured to fit within the recess of the heat sink, a spring configured to sit between the heat spreader and with the heat sink and bias the heat spreader towards and away from the heat sink, a flexible membrane attached to the heat sink and the heat spreader and seal off the recess, and a phase change material that fills the recess, wherein the flexible membrane contains the phase change material and allows it to contract or expand in response to the movement of the heat spreader towards or away from the heat sink.

10 Claims, 4 Drawing Sheets

(51) Int. Cl.
*B23P 15/26* (2006.01)
*H01L 23/433* (2006.01)
*F28D 20/02* (2006.01)

(52) U.S. Cl.
CPC .......... *H01L 23/4338* (2013.01); *F28D 20/02* (2013.01); *H01L 2924/0002* (2013.01); *Y10T 29/4935* (2015.01)

(58) Field of Classification Search
USPC .................................................. 165/46, 185
See application file for complete search history.

(56) References Cited

U.S. PATENT DOCUMENTS

| | | | |
|---|---|---|---|
| 4,092,697 A * | 5/1978 | Spaight ........................ 361/718 |
| 4,323,914 A * | 4/1982 | Berndlmaier et al. ........ 257/713 |
| 4,819,713 A | 4/1989 | Weisman |
| 4,824,303 A | 4/1989 | Dinger |
| 4,879,634 A | 11/1989 | Storrow et al. |
| 4,909,752 A | 3/1990 | Hallum et al. |
| 5,000,256 A * | 3/1991 | Tousignant ..................... 165/46 |
| 5,010,444 A | 4/1991 | Storrow et al. |
| 5,071,013 A | 12/1991 | Peterson |
| 5,220,485 A | 6/1993 | Chakrabarti |
| 5,224,016 A | 6/1993 | Weisman et al. |
| 5,245,508 A * | 9/1993 | Mizzi ............................ 361/694 |
| 5,367,196 A | 11/1994 | Mahulikar et al. |
| 5,485,671 A * | 1/1996 | Larson et al. ........... 29/890.032 |
| 5,557,501 A * | 9/1996 | DiStefano et al. ........... 361/704 |
| 5,608,610 A * | 3/1997 | Brzezinski .................... 361/704 |
| 5,859,764 A | 1/1999 | Davis et al. |
| 6,212,075 B1 | 4/2001 | Habing et al. |
| 6,285,564 B1 | 9/2001 | O'Brien |
| 6,653,741 B2 | 11/2003 | Sreeram et al. |
| 6,687,130 B2 | 2/2004 | Adams, Sr. et al. |
| 6,744,269 B1 | 6/2004 | Johnson et al. |
| 6,849,941 B1 | 2/2005 | Hill et al. |
| 7,031,167 B1 | 4/2006 | Zagoory et al. |
| 7,096,926 B2 * | 8/2006 | Belady et al. .................. 165/46 |
| 7,180,737 B2 | 2/2007 | Straub, Jr. et al. |
| 7,322,843 B1 | 1/2008 | Lee et al. |
| 7,349,221 B2 | 3/2008 | Yurko |
| 7,539,027 B2 * | 5/2009 | Callahan et al. ............. 361/803 |
| 7,709,951 B2 * | 5/2010 | Brodsky et al. .............. 257/713 |
| 7,755,899 B2 | 7/2010 | Stenmark |
| 7,995,344 B2 * | 8/2011 | Dando et al. ................. 361/710 |
| 8,012,799 B1 | 9/2011 | Ibrahim et al. |
| 8,045,332 B2 | 10/2011 | Lee et al. |
| 2002/0070445 A1 * | 6/2002 | Tarter ........................... 257/714 |
| 2003/0178174 A1 | 9/2003 | Belady |
| 2007/0141378 A1 | 6/2007 | Pacheco et al. |
| 2007/0253169 A1 | 11/2007 | Clawser |
| 2008/0073775 A1 | 3/2008 | Brunschwiler |
| 2008/0190585 A1 * | 8/2008 | Lundell et al. ................. 165/46 |
| 2008/0239690 A1 | 10/2008 | Harvey et al. |
| 2009/0146292 A1 | 6/2009 | Drake |
| 2011/0261537 A1 | 10/2011 | Sporer et al. |

FOREIGN PATENT DOCUMENTS

| | | |
|---|---|---|
| EP | 0740340 B1 | 6/2002 |
| JP | 2009026870 A | 2/2009 |

OTHER PUBLICATIONS

Hannafin et al., "A Novel Approach to Thermal Management and EMI Shielding Via a Metallic Conformal Coating on a Plastic Housing", Originally published in the Proceedings of the IMAPS, Telecom Hardware Solutions Conference, pp. 1-3, May 2002.
International Search Report and Written Opinion issued in connection with related PCT Application No. PCT/US2013/038638 dated Jan. 7, 2014.

* cited by examiner

FLEXIBLE METALLIC HEAT CONNECTOR

I. CROSS REFERENCE TO RELATED APPLICATION

This application is related to U.S. provisional application 61/599,191 filed on Feb. 15, 2012, which is hereby incorporated by reference

II. FIELD OF THE INVENTION

The subject matter disclosed herein relates generally to a system and method for heat dissipation. More particularly, the subject matter disclosed herein relates to thermal connectors between heat generating devices and heat sinks.

III. BACKGROUND OF THE INVENTION

Electronic devices and other devices often produce heat during operation that needs to be dissipated away from the device. Heat sinks are often used for this purpose; a heat sink is a passive component that cools a device by dissipating heat into the surrounding environment. In order for the heat sink to operate properly, the heat from the device must be transferred to the heat sink over a thermal connection. While the term heat sink is used herein it should be understood that the term refers to all types of heat dissipating devices, including heat pipe modules and thermal ground planes.

A common arrangement for electronic devices is a plurality of electronic components attached to a printed circuit board (PCB). Heat from these multiple components is transferred to one or more heat sinks using thermal connections. Each component on the PCB is a particular distance from the heat sink (tolerance) and the heat must be effectively transferred across the tolerance from the component to the heat sink. Accordingly, the tolerance is often filled with a thermal connector, such as a heat spreader and/or thermal interface material.

When a single heat sink serves multiple components, the thermal connectors often must accommodate several different tolerances. Some of the proposed solutions for this issue include the use of thermal pastes, thermal greases, and thermally conductive pads that are compressible and expandable. These thermal connectors typically have fairly low thermal conductivities, in the range of 3 watts per meter kelvin (W/mK). Some thermal pads have conductivity as high as 17 W/mK but they can only be compressed to 10%-20% between the heat sink and the component or the component will be damaged. This limits the size of the starting gap between the component and the heat sink and makes it more difficult to assemble the device.

Accordingly, there is a need for better thermal connectors to transfer heat between heat generating components and heat sinks. More particularly, there is a need for thermal connectors that accommodate a variety of tolerances between multiple components of a heat generating device and a heat sink.

IV. SUMMARY OF THE EMBODIMENTS

In at least one aspect, the present disclosure provides a thermal connector configured to be placed within a recess of a heat sink between the heat sink and a heat generating component and transfer heat from the component to the heat sink. The thermal connector includes a heat spreader configured to fit within the recess of the heat sink, a spring configured to sit between the heat spreader and with the heat sink and bias the heat spreader towards and away from the heat sink, a flexible membrane attached to the heat sink and the heat spreader and seal off the recess, and a phase change material that fills the recess, wherein the flexible membrane contains the phase change material and allows it to contract or expand in response to the movement of the heat spreader towards or away from the heat sink.

In at least another aspect, the present disclosure provides a cartridge for placing between a heat generating component and a heat sink for facilitating transfer of heat from the component to the heat sink. The cartridge includes a heat spreader and a spring attached to the heat spreader. The heat spreader and spring are circumferentially enclosed by a frame and a flexible membrane is attached to the frame and the heat spreader to define an open topped void filled by a phase change material. The spring, flexible membrane, and phase change material expand or contract to accommodate the tolerance between the heat sink and component.

In yet another aspect, the present disclosure provides a method for transferring heat from a heat generating component to a heat sink. The method includes the steps of providing the thermal connector or cartridge as described above and positioning the thermal connector or cartridge between a heat sink and a heat generating component. The thermal connector or cartridge can accommodate several different components.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

V BRIEF DESCRIPTION OF THE DRAWINGS

VI. DETAILED DESCRIPTION OF EMBODIMENTS OF THE INVENTION

The following detailed description is merely exemplary in nature and is not intended to limit the applications and uses disclosed herein. Further, there is no intention to be bound by any theory presented in the preceding background or summary or the following detailed description. While embodiments of the present technology are described herein primarily in connection with dissipation of heat from an electrical circuit board to a heat sink, the concepts are also applicable to other types of systems where it is desirable to transfer thermal energy from a heat generating component to a heat dissipation device.

In at least one aspect, the present disclosure provides a device and method for the transfer of thermal energy from components on an electrical circuit board to a heat sink.

Figure 1:
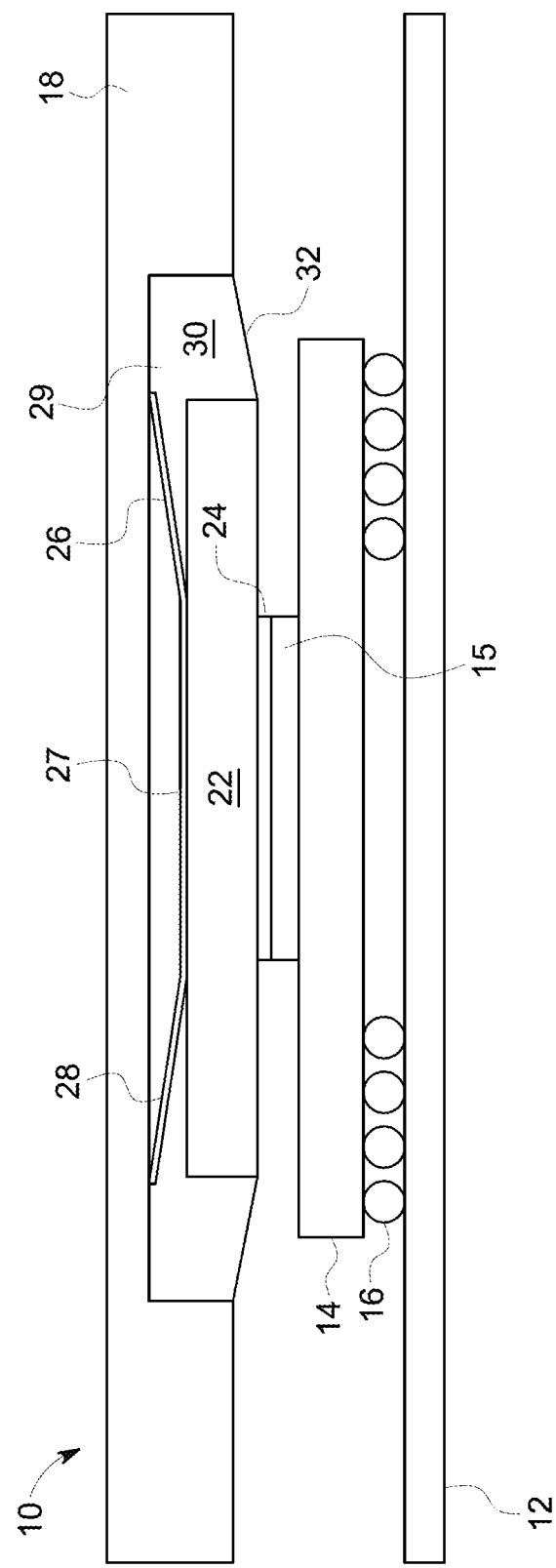
FIG. 1 illustrates a cross-sectional schematic view of a thermal connector in accordance with at least one embodiment of the present disclosure.

Thermal conductor 10 as applied in an electrical device is shown in FIG. 1. A portion of an electrical device includes a printed circuit board (PCB) 12 having an electrical device component 14 attached thereto via a ball grid array (BGA) 16. Silicon die 15 is a part of component 14 and a thermal interface material (TIM) 24 is connected to silicon die 15 to provide for thermal conductivity between silicon die 15 and the thermal conductor 10.

Heat sink 18 is displaced away from the PCB 12 and component 14 and there is a tolerance or gap (not numbered) there between that is filled here with the thermal conductor 10.

The thermal conductor 10 includes heat spreader 22 and spring 26. Desirably spring 26 includes body portion 27 and legs 28 extending away from the body portion 27 (shown more clearly in FIG. 2). Desirably, spring 26 is attached to heat spreader 22 at its body portion 27, leaving leg portions 28 free (as further illustrated by FIG. 2 and described below).

Heat sink 18 has a recess (not numbered) into which the assembly of the spring 26 and heat spreader 22 fits. A flexible membrane 32 is fixed to the edges of heat spreader 22 and heat sink 18 and seals off the void 29 between the heat sink 18 and heat spreader 22. The flexible membrane 32 can extend across the heat spreader 22 or simply to the edges thereof in order to adequately retain the phase change material.

Void 29 is filled by phase change material 30. Phase change material 30 is a material, most preferably a low melting point alloy, which melts at a particular temperature.

To assemble the thermal connector, the heat spreader 22 and spring 26 assembly is placed in the heat sink recess. The spring 26 is compressed to its smallest height while the phase change material 30 is in a melted state, and then the phase change material 30 is hardened by lowering the temperature.

The thermal connector is deployed by raising the temperature to the melting point of the phase change material 30. The melting of the phase change material 30 allows the spring 26 to expand and the spring 26 will push heat spreader 22 into thermal contact with component 14 (via TIM 24).

The tolerance between a heat sink and heat generating component in an electrical device ranges from about 0.1 mm to about 3 mm, more specifically about 0.3 to 1 mm, and is typically about 0.8 mm. Accordingly, the thermal conductor should be able to expand to fit this range.

Figure 2:
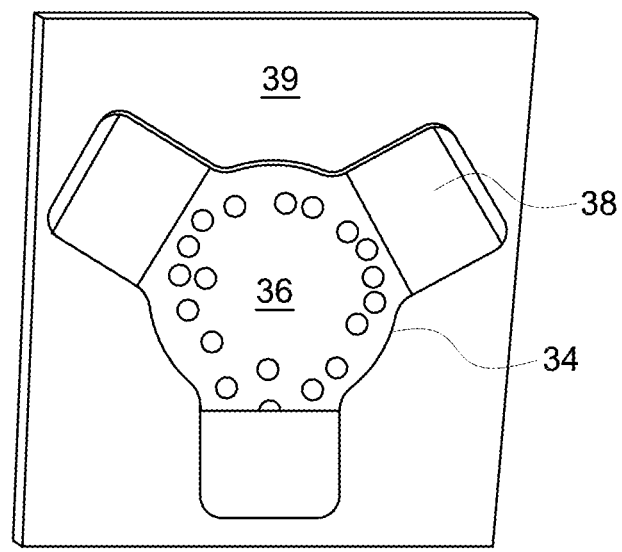
FIG. 2 illustrates a top plan view of the spring in accordance with at least one embodiment of the present disclosure.

FIG. 2 illustrates one embodiment of the spring 34, having a main body 36 and legs 38. Here, spring 34 is shown having three legs 38 but it could have more or less legs. Spring main body 36 is fixed to a heat spreader 39 such as by spot welding or soldering. The spring 34 is preferably made out of an alloy such as beryllium copper (BeCu). It can be from about 0.10 mm to 0.40 mm in thickness, or more preferably from about 0.20 mm to 0.30 mm in thickness. The spring thickness and dimensions are chosen to achieve the correct loading for the device when compressed. In other words, and referring to FIG. 1, the spring 26 should exert sufficient pressure on the heat spreader 22 to hold it against TIM 24 and achieve good thermal contact. However, spring 26 should not cause heat spreader 22 to exert an amount of pressure that damages TIM 24 or the component 14. In one embodiment, the spring 34 is nickel plated, to increase its wettability with the phase change material, as described below.

Phase change material 30 is desirably a material that is solid at near room temperature and melts at a temperature to deploy the spring. As one example, for many electronic devices, a phase change material having a melting point between about 40° C. to 250° C. is appropriate, more preferably from about 60° C. to 160° C. One preferred metal alloy is 52In 48Sn which has a melting point of 118° C. and a thermal conductivity of 35 W/mK. This alloy is available from Indium Corporation under the trademark Indalloy® 1E. Eutectic alloys are preferred but are not required. Mixtures or pastes could also be used.

Other metals and metal alloys that might be useful for certain applications include In, InBi, variations of InSn, BiSn, PbSn, SnAg, InPbAg, InAg, InSnBi, InGa, SnBiZn, SnInAg, SnAgCu, SnAgBi, and InPb.

In general, phase change materials having a thermal conductivity between about 20 W/mK and 400 W/mK are preferred, most desirably about 30 W/mK to 100 W/mK.

The flexible membrane 32 functions to retain the phase change material 30 within the void defined by the heat spreader 22 and the heat sink 18. Flexible membrane 32 is preferably a plastic film that can withstand the highest temperature reached by the operating device. For many electronic devices, a flexible membrane stable up to at least between about 150 to 200° C. is desirable, preferably up to at least 160° C. Options for the flexible membrane include polymers, silicon, urethane, rubbers, and metal foil. One specific example is Dureflex® U073 125 μm which is a polyether-based thermoplastic polyurethane film. Flexible membrane 32 can be attached to heat sink 18 and heat spreader 22 with an appropriate adhesive.

Heat sink 18 can be a typical heat sink as used in the art, such as an aluminum alloy plate. As discussed above, other heat dissipating devices such as heat pipe modules and thermal around planes can be used with the thermal conductors as described herein. As an example, the recess in the heat sink 18 can be about 2.25 mm.

Heat spreader 22 can be a typical heat spreader as used in the art, such as a copper plate. Other materials can be used as well, such as aluminum nitride (AlN) plates. Copper offers a higher thermal conductivity but aluminum nitride offers electrical isolation of the heat generating component from the heat sink. The heat spreader can be of a variety of sizes, such as those presently used in the art.

Thermal interface material 24 can also be a material typically used in the art, such as a paste or thermal grease.

The metal parts that are in contact with the phase change material (heat sink, heat spreader, spring) may be treated to increase their wettability by the phase change material 30. One treatment is a nickel plating with gold flash which increases the wettability of the parts with the metal alloy 52In 48Sn. This treatment is known in the art.

Figure 3:
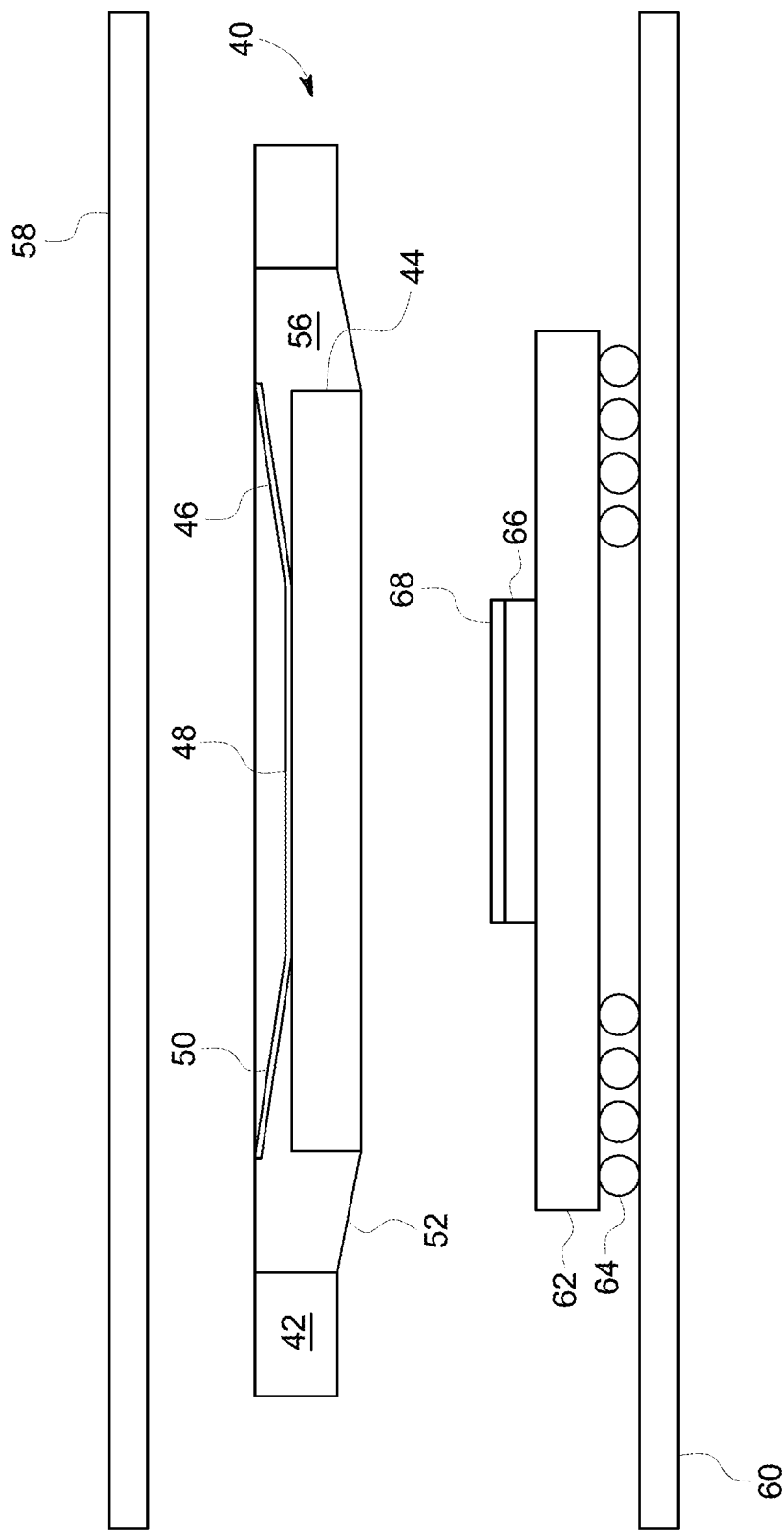
FIG. 3 illustrates a cross-sectional schematic view of a thermal connector cartridge in accordance with at least one embodiment of the present disclosure in exploded view with a heat sink and heat generating component.

FIG. 3 illustrates another embodiment of a thermal conductor in accordance with the disclosure. In this embodiment, the thermal conductor is assembled as a cartridge 40 including the heat spreader 44 and spring 46. As in the prior embodiment, spring 46 is desirably connected to heat spreader 44 at its body portion 48, leaving legs 50 free.

A frame 42 circumferentially surrounds the heat spreader 44/spring 46 assembly and a flexible membrane 52 extends from the frame to the heat spreader. Phase change material 56 fills the void created by frame 42, flexible membrane 52, and heat spreader 44. The cartridge 40 is open on the top, so that the phase change material 56 is exposed.

In one embodiment of assembling the heat connector cartridge 40, the spring 46 is attached to heat spreader 44 and flexible membrane 52 is attached to the frame 42 and heat spreader 44. The phase change material 56 is melted and placed in the void created by frame 42, flexible membrane 52, and heat spreader 44. The spring 46 is flattened to its lowest height and the temperature lowered to harden the phase change material 56. The cartridge 40 can then be attached to the heat sink 58 using a sealant or adhesive.

As shown in exploded form in FIG. 3, the cartridge 40 is installed between a heat sink 58 and electrical device. The electrical device includes PCB 60 having an electrical device component 62 attached thereto via a ball grid array (BGA) 64. Silicon die 66 is a part of component 62 and a thermal interface material (TIM) 68 is connected to silicon die 66 to provide for thermal conductivity between silicon die 66 and the thermal conductor 40.

In use, the thermal connector cartridge 40 is placed between the heat sink 58 and the device component 62 (or multiple components). Desirably the cartridge is attached to the heat sink 58 such as by adhesive or other mechanical means such as fasteners. The assembly is deployed by heating to the melting point of the phase change material 56, which allows the spring 46 to expand or contract and engage the heat spreader 44 with the TIM 68 or component 62 on the other side. The flexible membrane 52 will expand or contract as needed to accommodate this expansion or contraction of the phase change material 56.

As discussed above, the tolerance between a heat sink and heat generating component in an electrical device ranges from about 0.1 mm to about 3 mm and is typically about 0.8 mm. Accordingly, the cartridge should be an appropriate thickness to fit within the gap and the spring should be able to expand to fill the gap.

The elements in this embodiment can have essentially the same properties as in the embodiment discussed above. Frame 42 can be made out of a number of materials. One option is aluminum and another option is a high melting point plastic. The frame can be a variety of sizes and is at least partially dependent on the size of the heat spreader. For an example, a frame that is about 35 mm square and having 3 mm thick walls works well with a heat spreader that is 20 mm square.

Figure 4:
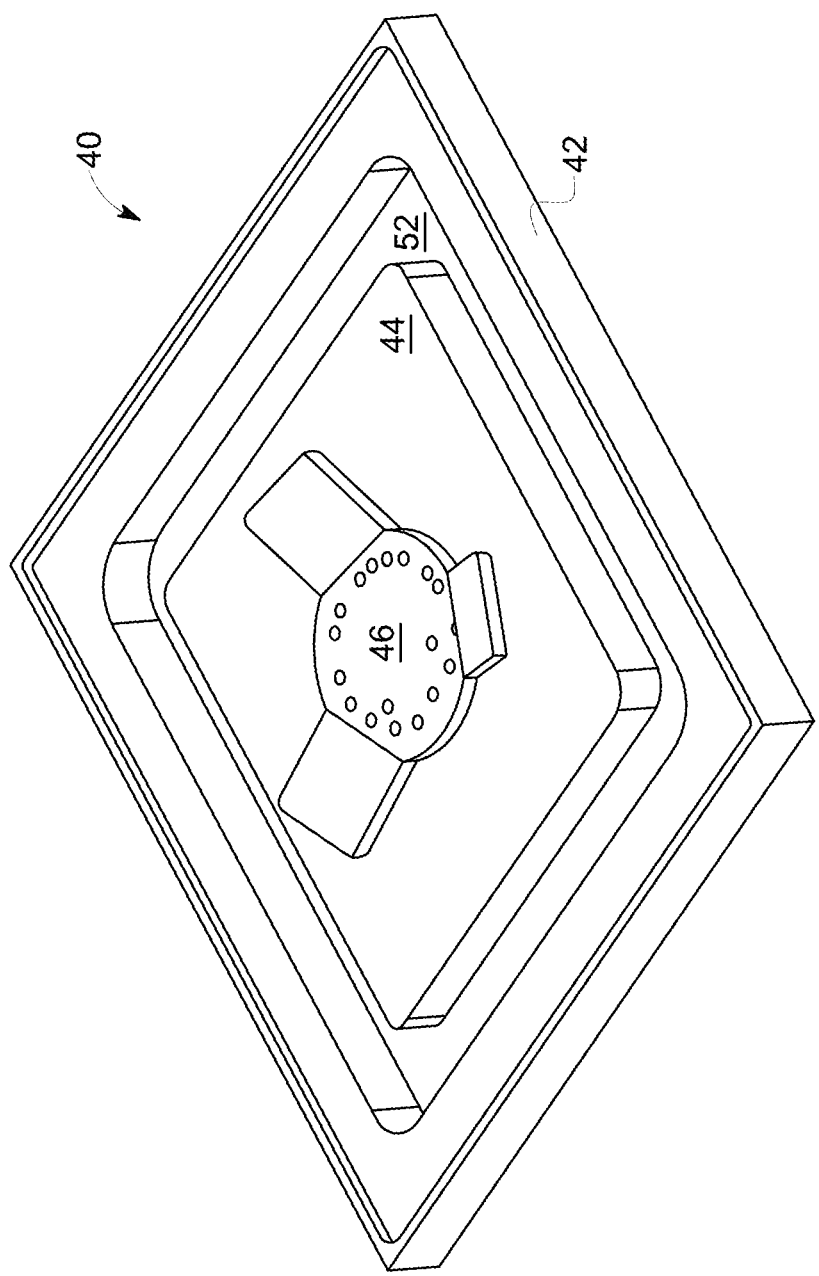
FIG. 4 is a perspective view of the thermal connector cartridge of FIG. 3.

FIG. 4 further illustrates the cartridge 40 of the embodiment shown in FIG. 3. Frame 42 circumferentially surrounds the heat spreader 44 which has spring 46 attached thereto. Flexible membrane 52 encloses the void between the heat spreader 44 and frame 42 on one side thereof. The cartridge 40 as shown here has not yet been filed with phase change material.

Alternative embodiments, examples, and modifications which would still be encompassed by the disclosure may be made by those skilled in the art, particularly in light of the foregoing teachings. Further, it should be understood that the terminology used to describe the disclosure is intended to be in the nature of words of description rather than of limitation.

Those skilled in the art will also appreciate that various adaptations and modifications of the preferred and alternative embodiments described above can be configured without departing from the scope and spirit of the disclosure. Therefore, it is to be understood that, within the scope of the appended claims, the disclosure may be practiced other than as specifically described herein.

We claim:

1. A thermal connector comprising;
    a heat sink having a recess;
    a heat spreader that fits into the recess of the heat sink;
    a spring, comprising a body portion that is connected flush with the heat spreader and a plurality of legs angled away from the heat spreader and towards the heat sink so that the plurality of legs contact the heat sink when the heat spreader is fit into the recess of the heat sink;
    a flexible membrane attached to the heat sink and to the heat spreader, so that the membrane seals off the recess; and
    a phase change material that fills the void defined by the heat sink, flexible membrane, and heat spreader, wherein the phase change material holds the spring compressed to its smallest height so that when the thermal connector is heated and the phase change material is melted, the heat spreader is pushed by the spring away from the heat sink and into contact with a heat generating component positioned adjacent to the heat sink;
    wherein the flexible membrane allows the phase change material to expand in response to the movement of the heat spreader away from the heat sink.

2. The thermal connector of claim 1, wherein the thermal connector makes a thermal connection between the heat spreader and the heat generating component.

3. The thermal connector of claim 1 wherein the flexible membrane is a silicone or urethane polymer.

4. The thermal connector of claim 1 wherein the phase change material is a low melting alloy.

5. The thermal connector of claim 1, wherein the phase change material has a melting point between about 40° C. to 250° C. and a thermal conductivity between about 20 W/mK and 400 W/mK.

6. The thermal connector of claim 1, wherein the phase change material has a melting point between about 60° C. to 160° C. and a thermal conductivity between about 30 W/mK and 100 W/mK.

7. The thermal connector of claim 4 wherein the low melting alloy has a melting point of about 118° C. and a thermal conductivity of about 3 5 W/mK.

8. The thermal connector of claim 4 wherein the heat generating component is an electrical device component.

9. The thermal connector of claim 1, wherein the spring biases the heat spreader within a range of 0.1 mm to 3 mm.

10. A method to thermally connect a heat generating component and a heat sink having a gap there between comprising the steps:
    providing a thermal connector comprising:
        a heat spreader and a spring, the spring comprising a body portion that is connected flush with the heat spreader and a plurality of legs angled away from the heat spreader;
        a low melting point alloy surrounding the spring, wherein (i) when the alloy is in a melted state, the spring may move the heat spreader, and (ii) when the alloy is in a hardened state, the spring may not move the heat spreader;
        a flexible membrane that contains the low melting point alloy within the gap and allows the alloy to contract and expand in response to the movement of the heat spreader towards and away from the heat sink;
    melting the alloy to a melted state;
    compressing the spring to its smallest height;
    cooling the alloy to a hardened state to hold the spring in compression;
    placing the thermal connector in the gap between the heat sink and the heat generating component; and heating the alloy above a melting temperature so that the alloy melts allowing the spring to move the heat spreader away from the heat sink and into thermal contact with the heat generating component.

\* \* \* \* \*